United States Patent [19]
Fujikawa et al.

[11] Patent Number: 5,943,105
[45] Date of Patent: Aug. 24, 1999

[54] LIQUID CRYSTAL DISPLAY DEVICE HAVING SPECIFIED STRUCTURE FOR CONTACT HOLE CONNECTING PIXEL ELECTRODE WITH SOURCE/DRAIN ELECTRODES VIA A CONNECTING ELECTRODE

[75] Inventors: Takashi Fujikawa; Hirohiko Nishiki, both of Tenri; Yoshiharu Kataoka, Suita, all of Japan

[73] Assignee: Sharp Kabushiki Kaisha, Osaka, Japan

[21] Appl. No.: 08/882,645

[22] Filed: Jun. 25, 1997

[30] Foreign Application Priority Data

Jun. 28, 1996 [JP] Japan ..................... 8-169099

[51] Int. Cl.⁶ .......................... G02F 1/1343; H01L 29/04
[52] U.S. Cl. .............................. 349/39; 349/38; 349/140; 257/57
[58] Field of Search .............................. 349/140, 44, 38, 349/39, 57; 247/57

[56] References Cited

U.S. PATENT DOCUMENTS

| | | | |
|---|---|---|---|
| 4,816,885 | 3/1989 | Yoshida et al. | 349/140 |
| 4,821,092 | 4/1989 | Noguchi | 349/140 |
| 4,857,907 | 8/1989 | Koden | 349/140 |
| 5,003,356 | 3/1991 | Wakai et al. | 349/44 |
| 5,187,602 | 2/1993 | Ikeda et al. | 349/39 |
| 5,212,574 | 5/1993 | Katayama et al. | 349/38 |
| 5,453,856 | 9/1995 | Kim | 349/140 |
| 5,471,070 | 11/1995 | Shimada et al. | 257/57 |
| 5,641,974 | 6/1997 | den Boer et al. | 257/59 |
| 5,691,787 | 11/1997 | Shimada et al. | 349/140 |
| 5,708,483 | 1/1998 | Asai | 349/38 |
| 5,757,453 | 5/1998 | Shin et al. | 349/138 |

FOREIGN PATENT DOCUMENTS 5-249494  9/1993  Japan .

*Primary Examiner*—William L. Sikes
*Assistant Examiner*—Kari M. Horney
*Attorney, Agent, or Firm*—Dike, Bronstein, Roberts & Cushman, LLP; David G. Conlin; George W. Neuner

[57] ABSTRACT

A liquid crystal display device comprises a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, and, the width of the contact hole at the aperture surface of the contact hole is reduced by setting the height from the surface of the substrate to the bottom of the contact hole to be larger than the height of the contact hole.

13 Claims, 10 Drawing Sheets

LIQUID CRYSTAL DISPLAY DEVICE HAVING SPECIFIED STRUCTURE FOR CONTACT HOLE CONNECTING PIXEL ELECTRODE WITH SOURCE/DRAIN ELECTRODES VIA A CONNECTING ELECTRODE

BACKGROUND OF THE INVENTION

1. Field of the Invention

The present invention relates to a liquid crystal display device. More particularly, this invention relates to a liquid crystal display device having a wide display area, a highly fine definition and a high aperture ratio.

2. Description of the Related Arts

The construction of an active matrix substrate in a conventional liquid crystal display device is shown in FIG. 8.

In this liquid crystal display device, a plurality of pixel electrodes 12 are provided in a matrix on a transparent insulating substrate 11, and with each of these pixel electrodes 12 is connected a thin film transistor (hereinafter referred to as "TFT") 13 as a switching element. Moreover, a gate signal wiring 14 and a common additive capacitance wiring 15 as running in parallel therewith are formed alternately along each row of the pixel electrodes 12. A source signal wiring 16 is formed along each column of the pixel electrodes 12.

FIG. 9 is a plan view illustrating the construction of one pixel portion on an active matrix substrate in the conventional liquid crystal display device. Further, FIG. 10(a) is a sectional view of FIG. 9 viewed from the A-A' line, and FIG. 10(b) is a sectional view of FIG. 9 from the B-B' line (illustrating the TFT structure). As shown in FIG. 9, FIG. 10(a) and FIG. 10(b), a plurality of pixel electrodes 12 are provided in a matrix form, and the gate signal wiring 14 and the source signal wiring 16 are provided to perpendicularly cross each other, passing around the periphery of the pixel electrode 12. A part of these gate signal wiring 14 and source signal wiring 16 each overlaps the peripheral portion of the pixel electrode 12. Moreover, a TFT 13 as a switching element connected with the pixel electrode 12 is provided at the crossing portion of the gate signal wiring 14 and the source signal wiring 16. The gate signal wiring 14 is connected with the gate electrode of TFT 13 so that TFT 13 can be driven and controlled by a signal inputted into the gate electrode. Further, the source signal wiring 16 is connected with the source electrode of TFT 13, into which a data signal is inputted. Furthermore, the drain electrode of TFT 13 is connected with a connecting electrode 28 and also with the pixel electrode 12 via a contact hole 17, and then with the common additive capacitance wiring 15 via the connecting electrode 28.

Furthermore, as shown in FIG. 10(a), the gate signal wiring 14 and the common additive capacitance wiring 15 are formed on the transparent insulating substrate 11, and a gate insulating film 20 is formed so as to cover both wirings 14 and 15. The connecting electrode 28 connected with the drain electrode of the TFT 13 in FIG. 9 is also formed above the common additive capacitance wiring 15. In this way, an additive capacitance is generated by forming the common additive capacitance wiring 15 and the connecting electrode 28 with the gate insulating film 20 interposed in between. Furthermore, an interlayer insulating film 18 is formed on the substrate, and the pixel electrode 12 formed on the interlayer insulating film 18 is connected with the underlying connecting electrode 28 via the contact hole 17 formed to penetrate the interlayer insulating film 18 on the common additive capacitance wiring 15. This allows the pixel electrode 12 to be connected with the drain electrode of the TFT 13 of FIG. 9.

Furthermore, as shown in FIG. 10(b), a gate electrode 22, a gate insulating film 20, a silicon semiconductor layer 23 and an etching stopper 24 as a channel layer protective layer are formed sequentially on the transparent insulating substrate 11. Moreover, a first $n^+$ silicon film 25 and a second $n^+$ silicon film 26 are separately formed so that the first $n^+$ silicon film 25 is electrically connected with a double-layer source electrode 27 and the second $n^+$ silicon film 26 is electrically connected with a double-layer drain electrode 19.

The process for manufacturing the device as shown in FIG. 10(a) is now explained hereafter.

In FIG. 11(a), the TFT 13, the gate signal wiring 14, the common additive capacitance wiring 15, the source signal wiring 16 and the connecting electrode 28 are formed on the transparent insulating substrate 11, and the contact hole 17 is formed, as shown in FIG. 11(b), after the interlayer insulating film 18 is formed.

Subsequently, the pixel electrode 12 is formed on the interlayer insulating film 18, as shown in FIG. 11(c). The connection of the pixel electrode 12 with the drain electrode 19 is achieved by connecting (i) the connecting electrode 28 connected with the drain electrode 19 and (ii) the pixel electrode 12 in the contact hole 17.

The active matrix substrate is constructed as described above. Here, since the interlayer insulating film 18 is formed between the gate signal wiring 14, the common additive capacitance wiring 15 and the source signal wiring 16, and the pixel electrode 12, it becomes possible to allow the pixel electrode 12 to overlap each of these signal wirings. By introducing a liquid crystal display device of such a construction, it is possible to improve the opening ratio and also prevent ill orientation of liquid crystal by shielding the electric fields attributable to each signal wiring.

In the liquid crystal display device as described above, the pixel electrode 12 is allowed to overlap the source signal wiring 16, and so there is an increase in the capacitance between the source signal wiring 16 and the pixel electrode 12. Also, because the pixel electrode 12 is allowed to overlap the gate signal wiring 14 for driving the TFT 13 of the pixel, there is an increase in the capacitance between the gate signal wiring 14 and the pixel electrode 12 so that the field-through of writing voltage into the pixel attributable to the switching signal of TFT 13 and the like would become bigger as a defect.

In order to overcome these problems, the interlayer insulating film 18 having a film thickness in the order of $\mu$m has heretofore been formed. As processes for forming such an interlayer insulating film 18, for example, there has been used a process for applying a photosensitive organic resin according to a spin coat method and then patterning by exposing and developing with an alkali.

In the case where a thick interlayer insulating film 18 was formed according to the conventional process, it is necessary to provide a taper in the contact hole 17 for ensuring the connection between the pixel electrode 12 and the underlying connecting electrode 28 and in particular for improving the coverage of the pixel electrode 12. Assuming here that the contact hole 17 had a bottom diameter of 5 $\mu$m, the aperture surface of the contact hole 17 would have a width of not less than 10 $\mu$m, taking into consideration a tapered region of the contact hole 17, alignment accuracy and the like. If the contact hole 17 had a tapered region larger than the metal layer of the underlying common additive capacitance wiring 15, leakage of light would occur to lower the quality of contrast. Therefore, it has been necessary to have the width of such an underlying common additive capacitance wiring larger than the contact region.

However, if the width of the common additive capacitance wiring was made larger than 10 µm in accordance with the above-mentioned example, it would cause an inconvenience of lowered opening ratio. Particularly, since the size of a pixel tends to decrease in accordance with the recent spread of highly fine definition of liquid crystal display devices, enlargement of the width of the common additive capacitance wiring 15 would result in remarkably impairing the performance of the liquid crystal display devices. Thus, an attempt was made to reduce the width of the aperture surface of the contact hole 17 by enlarging a tapering angle for the purpose of preventing leakage of light without widening the width of the common additive capacitance wiring 15. However, the enlargement of the tapering angle caused breaking of wiring because of deteriorated coverage of the pixel electrode 12 formed by the sputtering method, which resulted in causing a number of ill connections of the pixel electrode 12 with the underlying connecting electrode 28.

SUMMARY OF THE INVENTION

The present invention provides a liquid crystal display device comprising a gate signal wiring formed on a substrate, a data signal wiring insulated from the gate signal wiring and formed to perpendicularly cross the gate signal wiring, a switching element provided near the perpendicularly crossing portion of the gate signal wiring and the data signal wiring and having a gate electrode and source/drain electrodes, an interlayer insulating film, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, and, the width of the contact hole at the aperture surface of the contact hole is reduced by setting the height from the surface of the substrate to the bottom of the contact hole to be larger than the height of the contact hole.

According to the present invention, there is provided a liquid crystal display device in which a pixel electrode is overlapped with each signal wiring via an interlayer insulating layer, the deterioration of display quality due to leakage of light from the contact hole portion can be prevented without lowering the yield and with a high aperture ratio being maintained by optimizing the thickness of a layer under the contact hole relative to the thick interlayer insulating film.

BRIEF DESCRIPTION OF THE DRAWINGS

FIG. 1(a) is a plan view of a pixel portion, and FIG. 1(b) is a sectional view of FIG. 1(a) viewed from the 1(b)—1(b) line.

FIG. 2(a) through FIG. 2(f) show the manufacturing processes for the cross sections of FIG. 1(a) viewed from the A-A' line, FIG. 2(g) through FIG. 2(l) show the manufacturing processes for the cross sections of FIG. 1(b) viewed from the 2(l)—2(l) line, corresponding to FIG. 2(a) through FIG. 2(f), respectively.

DETAILED DESCRIPTION OF THE PREFERRED EMBODIMENTS

Figure 1A:
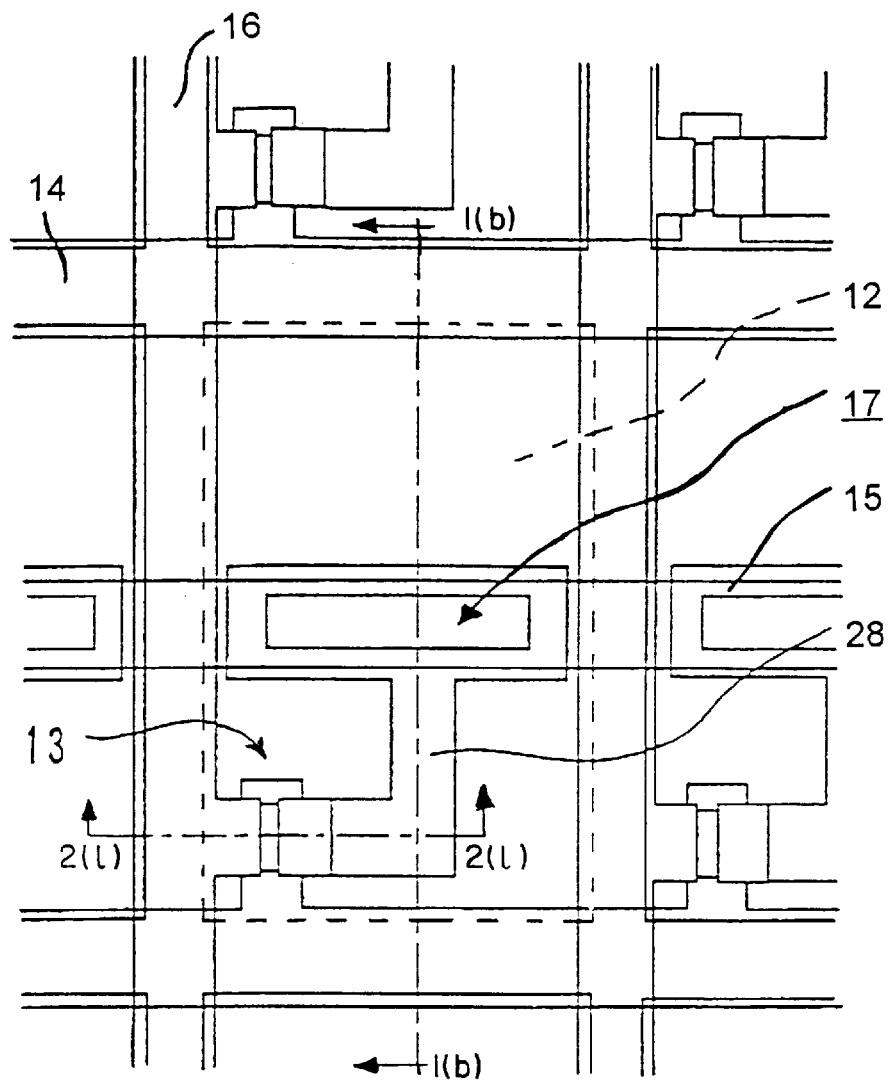
FIG. 1(a) and FIG. 1(b) show the construction of a liquid crystal display device in Example 1.

In the liquid crystal display device according to the present invention, a plurality of gate signal wirings and a plurality of data signal wirings cross each other, a pixel electrode is formed in the region surrounded by these wirings, and further a switching element is provided near the perpendicularly crossing portion of the gate signal wiring and the data signal wiring.

The substrate on which the liquid crystal display device is to be formed is not specifically limited, and may be a transparent substrate such as a glass substrate, a resin (e.g. polyethylene) substrate and the like.

The gate signal electrodes, the data signal electrodes and the pixel electrodes are made from electrically conductive materials, and, for example, they are made from aluminum, copper, silver, tantalum or transparent electrode materials such as $InO_3$, $SnO_2$, ITO (Indium Tin Oxide) or the like. In particular, the pixel electrode is preferably made from the transparent electrode materials.

The switching elements may be those elements normally used as a switching element. For example, MOS transistor, TFT and the like may be used, among them, the TFT is preferred. The switching element usually has a gate electrode, a gate insulating film and source/drain electrodes. The gate electrodes and the source/drain electrodes may be formed from electrically conductive materials normally used as an electrode such as polysilicon, silicide, polycide, aluminum, tantalum, titanium, copper or the like in a film thickness ranging from about 100 nm to 500 nm. The gate insulating film may be formed from $SiO_2$, SiN or the like in a film thickness ranging approximately from 200 nm to 500 nm. Regarding the switching element, incidentally, etching stoppers, etching masks and the like normally used at the time when the gate electrode and the source/drain electrodes layer are formed may be used as a protective film in the process of manufacturing the switching element. The gate electrode is connected with the gate signal wiring, and while one of the source/drain electrodes is connected with a data signal wiring, the other of the source/drain electrodes is connected to the pixel electrode via a contact hole penetrating through an interlayer insulating film and via a connecting electrode.

In addition, interlayer insulating films are formed between the gate signal electrode and the data signal electrode (particularly at the crossing portion), and between these electrodes and the pixel electrode, respectively. In particular, it is preferable that the interlayer insulating film between these electrodes and the pixel electrode has a film thickness ranging approximately from 2000 nm to 6000 nm and is made from $SiO_2$, SiN, PBSG or resins, such as acrylic, polyimide or the like.

In the present invention, it is preferable that an additive capacitance connected with the switching element is formed under the pixel electrode. The additive capacitance in this case comprises a common additive capacitance wiring, a gate insulating film and an electrically conductive layer formed on the substrate. The common additive capacitance wiring may be formed with the similar materials and in the similar film thickness, namely in a film thickness ranging approximately from 100 nm to 500 nm, and in a similar process, as used for the above-mentioned gate electrode, gate signal wiring, data signal wiring and the like. The wiring width of the common additive capacitance wiring in this case is preferably in the range approximately from 5 μm to 20 μm. The gate insulating film may also be formed in a similar manner, for example, in a film thickness of about 200 nm to 500 nm as in the gate insulating film of the switching element. Moreover, the electrically conductive layer may be formed with a similar material and in a similar film thickness, namely in a film thickness of about 100 nm to 500 nm, as used for the above-mentioned gate electrode, gate signal wiring, data signal wiring or the like.

While the electrically conductive layer provided on the upper surface of the additive capacitance is directly connected with the pixel electrode, it may also function as a connecting electrode connected with the other of the source/drain electrodes of the switching element or it may be connected with the connecting electrode via an insulating layer on this electrically conductive layer, and the connecting electrode may further be connected with the pixel electrode. Furthermore, even in the case where the electrically conductive layer is formed to function as a connecting electrode, the electrically conductive layer may be formed with a similar material and in a similar film thickness as mentioned above. Moreover, in the present invention, an electrically conductive film such as an electrode pad or the like may be formed on the connecting electrode so that the connecting electrode may be connected with the pixel electrode via this electrically conductive film. The electrically conductive film in this case may be formed with an electrically conductive material normally used for an electrode in a film thickness of about 100 nm to 500 nm.

As described above, the pixel electrode is connected with the switching element by connecting with the other of the source/drain electrodes via the contact hole penetrating through the interlayer insulating film and via the electrically conductive film and/or the connecting electrode. The aperture diameter at the surface of the contact hole is preferably about 5 μm to 20 μm, taking the etching accuracy or the like into consideration, and the aperture diameter at the bottom of the contact hole is preferably about 2 to 10 μm. Moreover, the contact hole can be formed by ordinary photolithographic and etching methods but the tapering angle is preferably about 30 to 70° relative to the surface of the substrate. By setting the tapering angle within such a range, leakage of light can be prevented without hindering the coverage of the pixel electrode or without increasing the opening ratio.

In the liquid crystal display device mentioned above, an explanation has been given of the case where the additive capacitance is disposed under the pixel electrode. The explanation on the above-mentioned device is likewise applicable to a liquid crystal display device of the so-called Cs on gate structure in which an additive capacitance is formed on a gate signal wiring, particularly in the case where the overlapping portion of a gate signal wiring and/or data signal wiring with a pixel electrode is large. In this case, it is preferable to set the width of a contact hole at the aperture surface of the contact hole so that it becomes smaller than the width of a gate signal wiring. The additive capacitance may also be formed on the data signal wiring, and in this case it is preferable to set the width of a contact hole at the aperture surface of the contact hole so that it becomes smaller than the width of the data signal wiring. Moreover, the additive capacitance need not be formed and, in such a case, an electrically conductive film, an interlayer insulating film or the like having a desired film thickness may be interposed between the source/drain electrodes and the connecting electrode, between the connecting electrode and the pixel electrode, or between the connecting electrode and the contact hole as long as the above-mentioned relation is maintained, namely, provided that the height from the surface of the substrate to the bottom of the contact hole is set to be larger than the height of the contact hole.

The liquid crystal display device of the present invention is now explained in detail below with reference to the drawings.

EXAMPLE 1

Figure 1B:
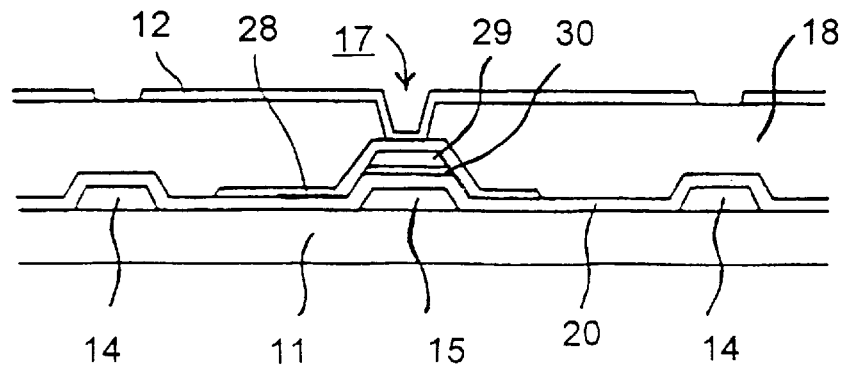

FIG. 1(a) and FIG. 1(b) are the drawings showing a construction of the liquid crystal display device in Example 1. FIG. 1(a) is a plan view of a pixel portion. FIG. 1(b) is an A-A' sectional view of the FIG. 1(a).

As shown in FIG. 1(a) and FIG. 1(b), the liquid crystal display device in this Example includes a plurality of pixel electrodes 12 provided in a matrix array, and a gate signal wiring 14 and a source signal wiring 16 provided so as to perpendicularly cross each other, passing around the periphery of these pixel electrodes 12. The gate signal wiring 14 and the source signal wiring 16 are partially overlapped with the outer peripheral portion of the pixel electrodes 12. Further, TFT 13 as a switching element connected with the pixel electrode 12 is provided in a crossing portion of the gate signal wiring 14 and the source signal wiring 16. The gate signal wiring 14 is connected with the gate electrode of this TFT 13, which is driven and controlled by the signal inputted into the gate electrode. Then, the source signal wiring 16 is connected with the source electrode of TFT 13, and the data signal is inputted into the source electrode of TFT 13. Moreover, the drain electrode of TFT 13 is connected with the pixel electrode 12 via a connecting electrode 28 and a contact hole 17 and also connected with a common additive capacitance wiring 15 via the connecting electrode 28.

Further, as shown in FIG. 1(b), the gate signal wiring 14 and the common additive capacitance wiring 15 are formed in a film thickness of 3000 Å on a transparent insulating substrate 11, and a gate insulating film 20 covering these wirings 14, 15 is formed in a film thickness of 3000 Å. Furthermore, a semiconductor layer 30 and an insulating layer 29 are formed in a film thickness of 1000 Å and 3000 Å respectively on the common additive capacitance wiring 15 for improving the shape of the contact hole 17. Moreover, the connecting electrode 28 connected with the drain electrode of TFT13 of FIG. 1(a) is formed in a film thickness of 1000 Å while covering the insulating layer 29. In this way, an additive capacitance is formed by a construction in which the semiconductor layer 30 connecting with the connecting electrode 28 and the common additive capacitance wiring 15 are formed to interpose the gate insulating film 20 therebetween. Additionally, an interlayer insulating film 18 is formed on the substrate, and the pixel electrode 12 formed on the interlayer insulating film 18 is connected with the underlying connecting electrode 28 via the contact hole 17 formed to penetrate through the interlayer insulating film 18 on the common additive capacitance wiring 15. This allows the pixel electrode 12 to be connected with the drain electrode of TFT.

In other words, in the liquid crystal display device of the present invention, the width of the aperture surface of the contact hole 17 is reduced relative to the width of the underlying common additive capacitance wiring by allowing the layer provided under the contact hole 17 to have a large film thickness relative to the thickly formed interlayer insulating film. Thereby, leakage of light can be prevented while keeping a high aperture ratio. Moreover, in the present invention, the tapering shape of the contact hole 17 can be improved without further changing the tapering shape of the contact hole 17 and width of the bottom of the contact hole 17 while using known processes for manufacturing the liquid crystal display device. Further, the TFT portion of the present invention has the similar construction as that of a conventional one.

Then, the process for manufacturing the liquid crystal display device is now explained below with reference to the drawings.

FIG. 2(a) through FIG. 2(l) are sectional views showing the process for manufacturing the liquid crystal display device mentioned above. FIG. 2(a) through FIG. 2(f) show the sections viewed from the A-A' line on the manufacturing process of FIG. 1(a). Further, FIG. 2(g) through FIG. 2(l) show the sections viewed from the B-B' line on the manufacturing process of FIG. 1(a), corresponding to FIG. 2(a) through FIG. 2(f), respectively.

Figure 2A:
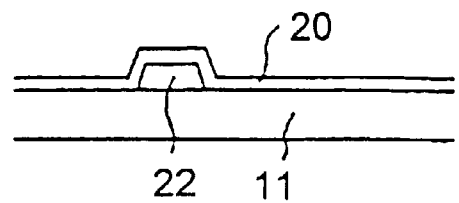
FIG. 2(a) through FIG. 2(l) are sectional views showing a process for manufacturing a liquid crystal display device in Example 1 according to the present invention.
Figure 2B:
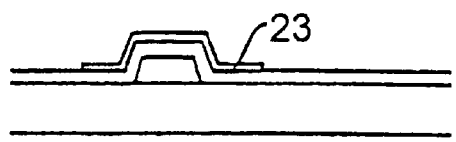
Figure 2C:
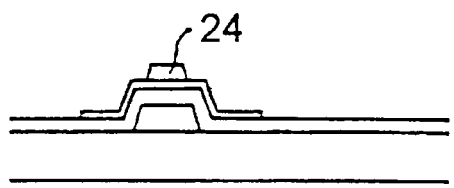
Figure 2D:
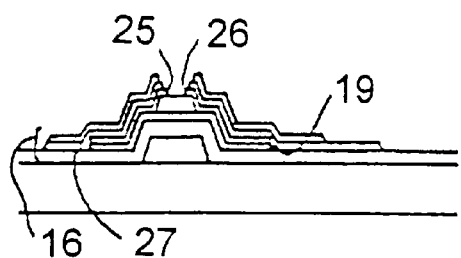
Figure 2E:
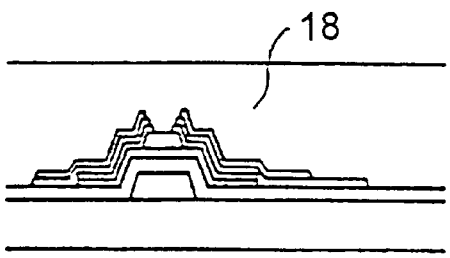
Figure 2F:
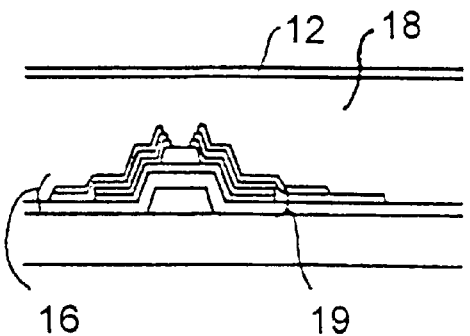
Figure 2G:
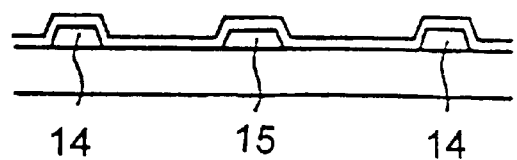

In FIG. 2(a) and FIG. 2(g), the gate signal wiring 14, the gate electrode 22 of TFT and the common additive capacitance wiring 15 are formed using tantalum in a film thickness of 3000 Å on the transparent insulating substrate 11, and then the gate insulating film 20 is formed in a film thickness of 3000 Å using silicon nitride.

Figure 2H:
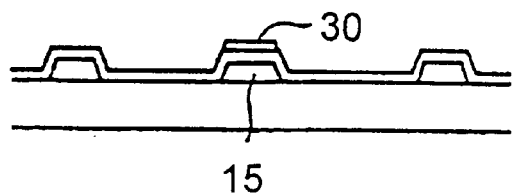

Then, as shown in FIG. 2(b) and FIG. 2(h), a semiconductor layer 23 of TFT and a semiconductor layer 30 on the common additive capacitance wiring 15 are formed at a time. At that time, the semiconductor layers 23 and 30 each has a film thickness of 1000 Å.

Figure 2I:
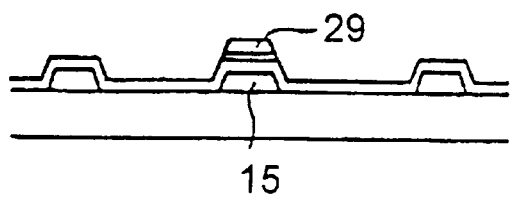

Subsequently, as shown in FIG. 2(c) and FIG. 2(i), an etching stopper 24 is formed at TFT portion and, at the same time, the insulating layer 29 is formed on the common additive capacitance wiring 15.

Figure 2J:
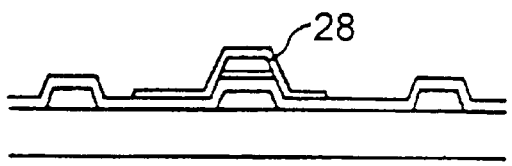

As shown in FIG. 2(d) and FIG. 2(j), the first $n^+$ silicon film 25 and the second $n^+$ silicon film 26 to function partly as the source electrode and the drain electrode in the TFT portion are separately formed. Thereafter a transparent electrically conductive film constituting the connecting electrode 28 and the lower layer of the source signal wiring 16 consisting of two layers, and a metal layer covering the drain electrode 19 and constituting the upper layer of the source signal wiring 16 are formed sequentially according to the sputtering method and patterned into a prescribed shape. At this time, the metal layer is also formed on the first $n^+$ silicon film 25 and the second $n^+$ silicon film 26 in the TFT portion, and thereby the two-layer source electrode 27 and the two-layer drain electrode 19 are formed, respectively. It is possible to reduce breaking of wirings by making the source signal wiring 16, the drain electrode 19 and the source electrode 27 into two layers respectively. This is because, even if there is any partial defect in one layer, electrical connection can be ensured by the other layer.

Figure 2K:
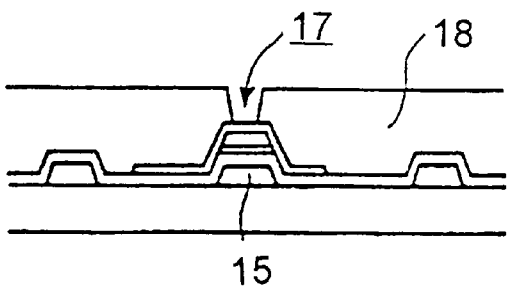

Then, as shown in FIG. 2(e) and FIG. 2(k), a photosensitive organic resin is formed as the interlayer insulating film 18 in a film thickness of 3 μm, and then exposure is made above the common additive capacitance wiring 15 so as to leave a rectangle of 5 μm×30 μm, which is treated with an alkaline solution. Thereby only the exposed portion is etched with an alkaline solution to have a tapering shape. Thus, the contact hole 17 penetrating through the interlayer insulating film 18 is formed.

Figure 2L:
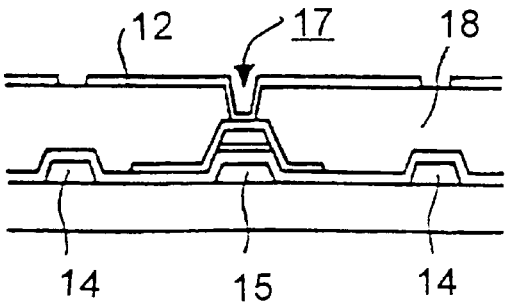

Subsequently, as shown in FIG. 2(f) and FIG. 2(l), a transparent electrically conductive film that will become the pixel electrode 12 is formed on the interlayer insulating film 18 by the sputtering method and patterned into a prescribed shape. The connection between the pixel electrode 12 and the drain electrode 19 is made by a construction in which the connecting electrode 28 connected with the drain electrode 19 is connected with the pixel electrode 12 via the contact hole 17 which is formed on the common additive capacitance wiring 15. Here, it is possible to overlap the pixel electrode 12 with the gate signal wiring 14, the common additive capacitance wiring 15 and the source signal wiring 16 because the interlayer insulating film 18 is formed between the pixel electrode 12 and each wiring. The opening ratio can be improved by having such a structure, and ill orientation of liquid crystal can be restrained by shielding the electric field caused by each signal wiring.

Accordingly, the active matrix substrate in the liquid crystal display device of Example 1 in the present invention has an improved tapering shape in the contact hole 17 by forming the insulating layer 29 and the semiconductor layer 30 between the connecting electrode 28 under the contact hole 17 and the gate insulating film 20. Silicon nitride has been formed as the insulating layer 29 in a film thickness of 3000 Å, and amorphous silicon has been formed as the semiconductor layer 30 in a film thickness of 1000 Å. Since the etching stopper 24 can be formed together with the insulating layer 29 at a time and TFT can be formed together with the semiconductor layer 30 at a time, there is no need of complicating the manufacturing process.

The liquid crystal display device of the present invention is now compared hereinafter with a conventional liquid crystal display device.

Figure 3:
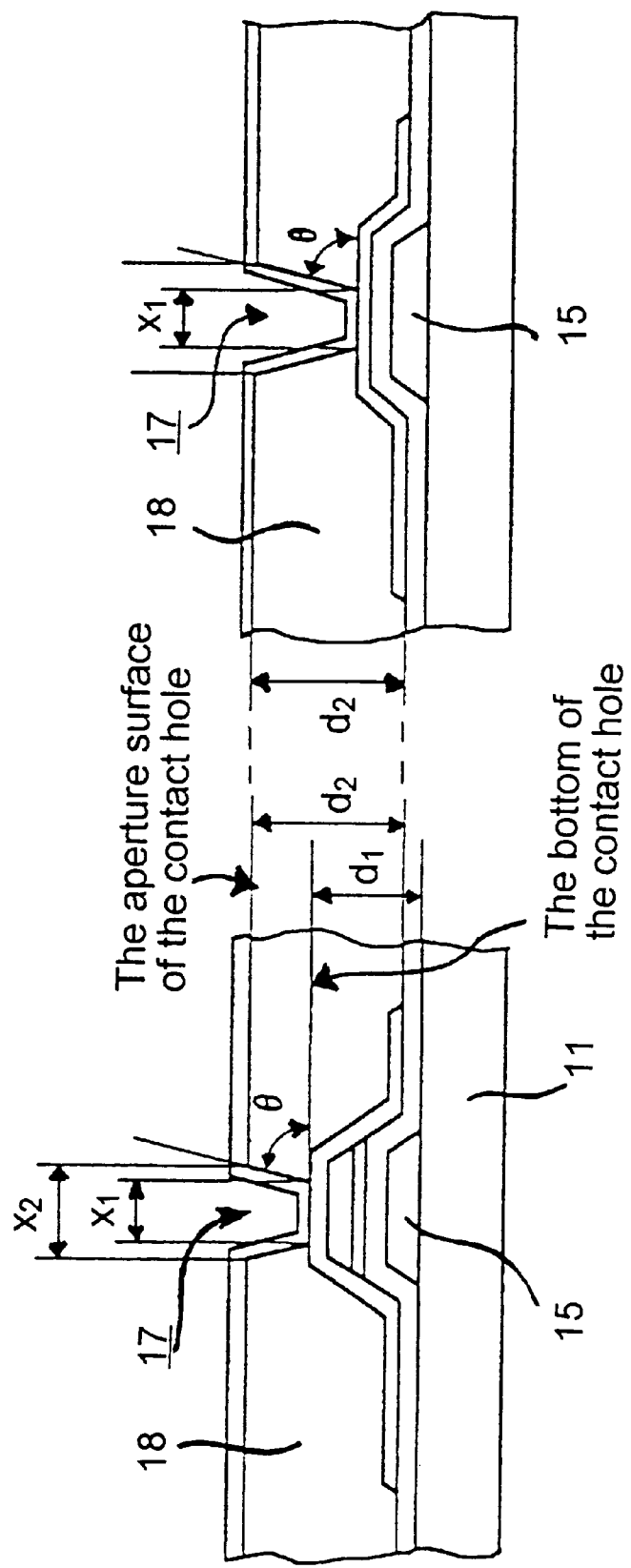
FIG. 3 shows a sectional view of the construction of a liquid crystal display device in the present invention in comparison with that of a conventional liquid crystal display device.

FIG. 3(a) and FIG. 3(b) are drawings to explain the difference between the liquid crystal display device of the present invention and a conventional liquid crystal display device. FIG. 3(a) is a sectional view of the liquid crystal display device of the present invention, and FIG. 3(b) is a sectional view of the conventional liquid crystal display device.

In FIG. 3(a), the width $x_2$ of the aperture surface of the contact hole 17 can be reduced by forming the layer $d_1$ under the contact hole 17, while maintaining the thickness $d_2$ of the interlayer insulating film 18, the tapering angle θ of the contact hole 17 and the width $x_1$ of the connecting portion of the bottom of the contact hole 17 to be equal to those of FIG. 3(b). Therefore, it is possible to prevent the leakage of light without the lowering of the opening ratio caused by forming the common additive capacitance wiring 15 thickly.

EXAMPLE 2

Figure 4:
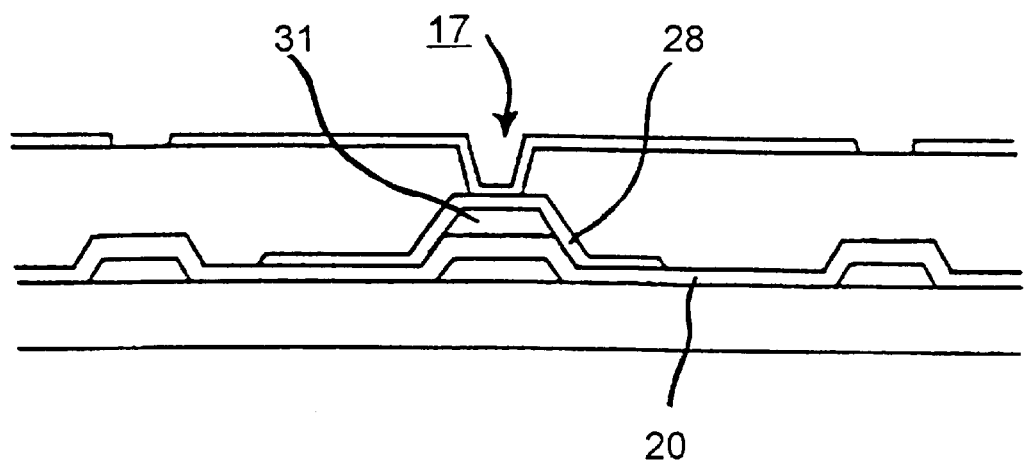
FIG. 4 is a sectional view showing the construction of a liquid crystal display device in Example 2 according to the present invention.

FIG. 4 is a sectional view showing the construction of the liquid crystal display device of the present invention. FIG. 4 corresponds to the section B-B' in FIG. 1(a).

As shown in FIG. 4, the tapering shape of the contact hole 17 has been improved by forming the semiconductor layer 31 between the connecting electrode 28 and the gate insulating film 20 under the contact hole 17. In Example 2, the semiconductor layer 31 is formed with amorphous silicon in a film thickness of 3000 Å. The amorphous silicon as the semiconductor layer 31 can be formed simultaneously with the semiconductor layer 23 of the TFT portion (in FIG. 2) explained in the above Example 1. Further, the semiconductor layer 31 may be formed simultaneously with the first $n^+$ silicon film 25 and the second $n^+$ silicon film 26 (both in FIG. 2) explained in the above Example 1 besides the semiconductor layer 23 of the TFT portion.

EXAMPLE 3

Figure 5:
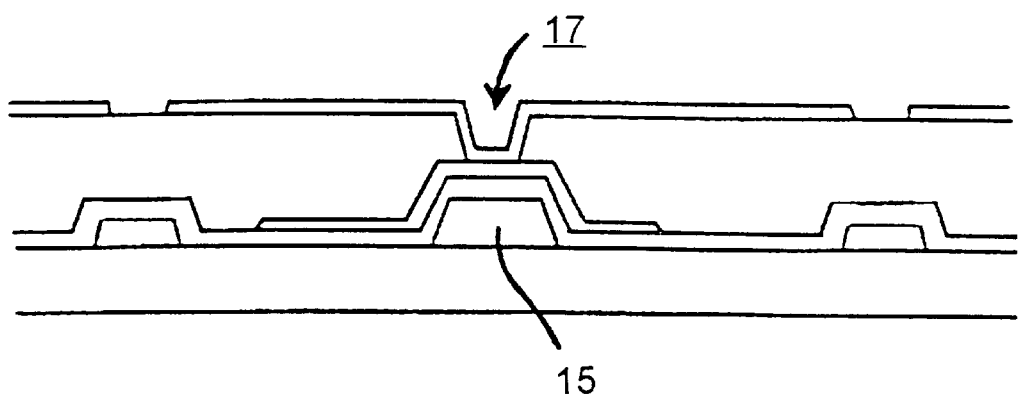
FIG. 5 is a sectional view showing the construction of a liquid crystal display device in Example 3 according to the present invention.

FIG. 5 is a sectional view showing the construction of the liquid crystal display device in Example 3. FIG. 5 corresponds to the section B-B' of FIG. 1(a).

As shown in FIG. 5, the tapering shape of the contact hole 17 is improved by forming the common additive capacitance wiring 15 thickly. In Example 3, the common additive capacitance wiring 15 is formed, for example, with tantalum in a film thickness of 6000 Å.

EXAMPLE 4

Figure 6:
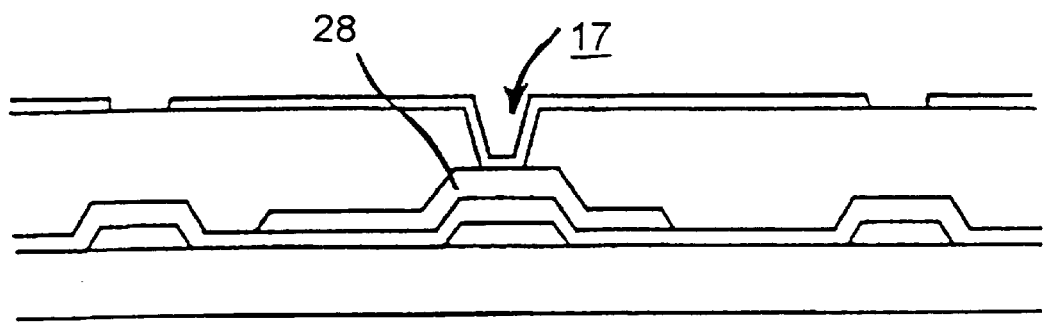
FIG. 6 is a sectional view showing the construction of a liquid crystal display device in Example 4 according to the present invention.

FIG. 6 is a sectional view showing the construction of the liquid crystal display device in Example 4. The position of FIG. 6 corresponds to the section B-B' of FIG. 1(a).

In FIG. 6, the tapering shape of the contact hole 17 is improved by forming the connecting electrode 28 thickly. In Example 4, the connecting electrode 28 is formed, for example, with ITO in a film thickness of 5000 Å. Deterioration of the display quality due to leakage of light can be prevented advantageously without reducing the additive capacitance by forming the connecting electrode 28 thickly.

EXAMPLE 5

Figure 7:
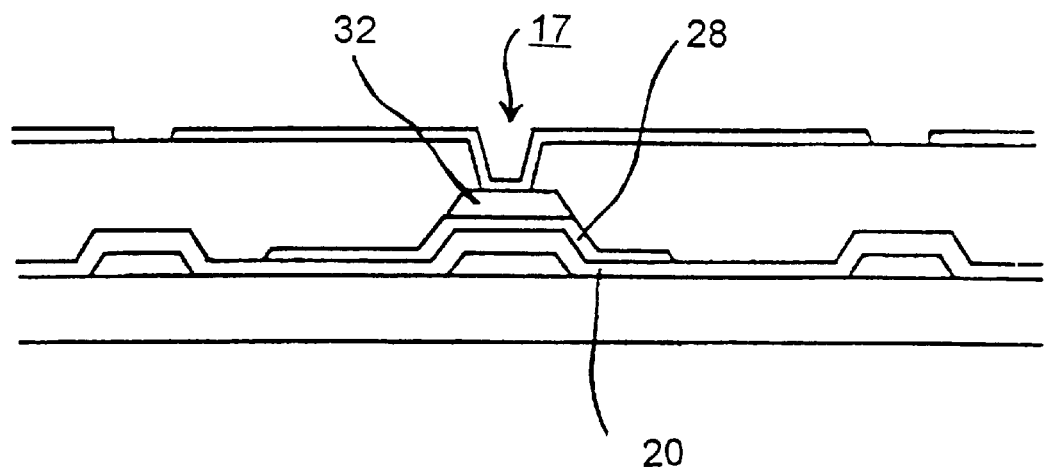
FIG. 7 is a sectional view of a liquid crystal display device in Example 5 according to the present invention.
Figure 8:
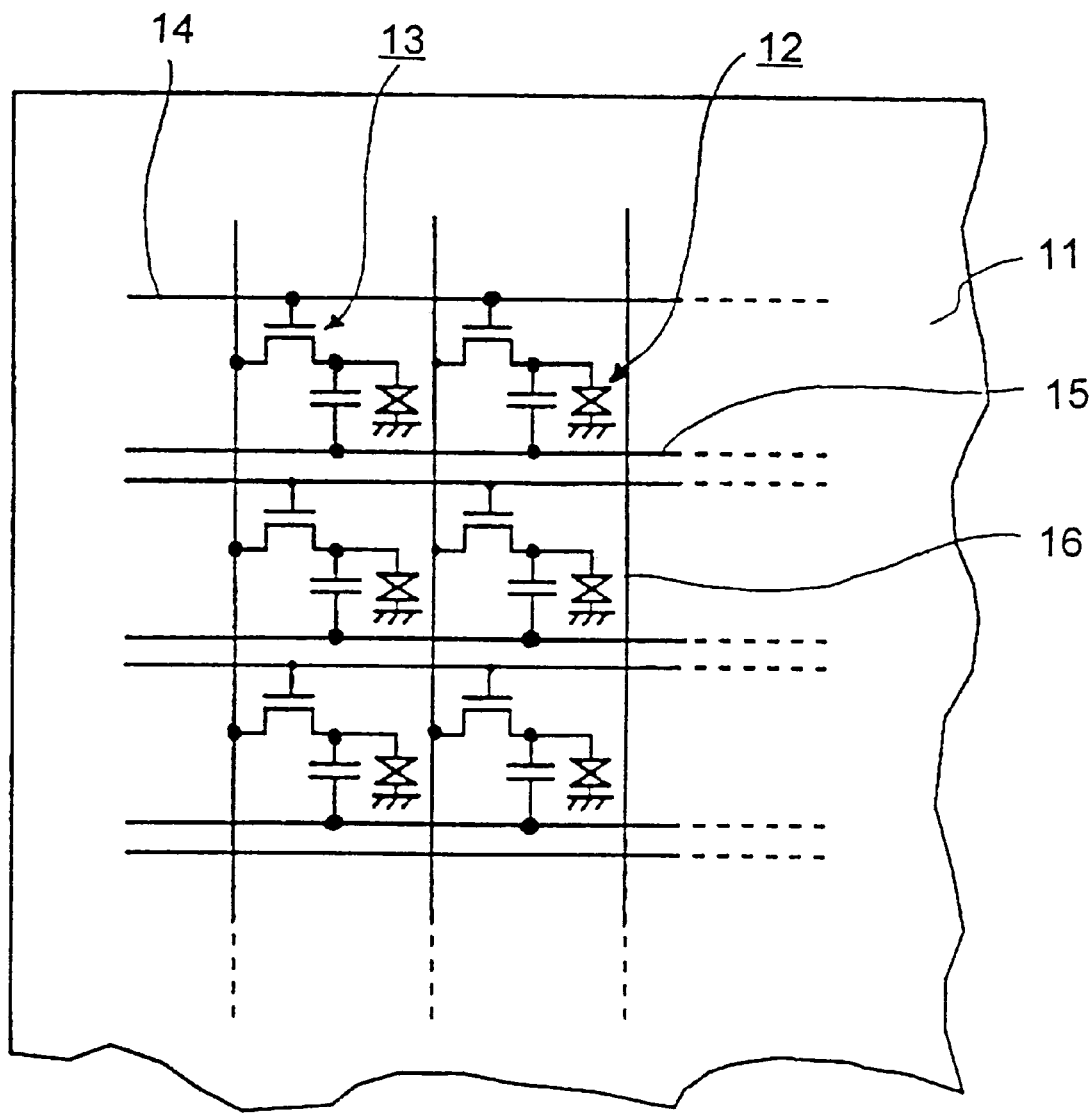
FIG. 8 shows the construction of an active matrix substrate in a conventional liquid crystal display device.
Figure 9:
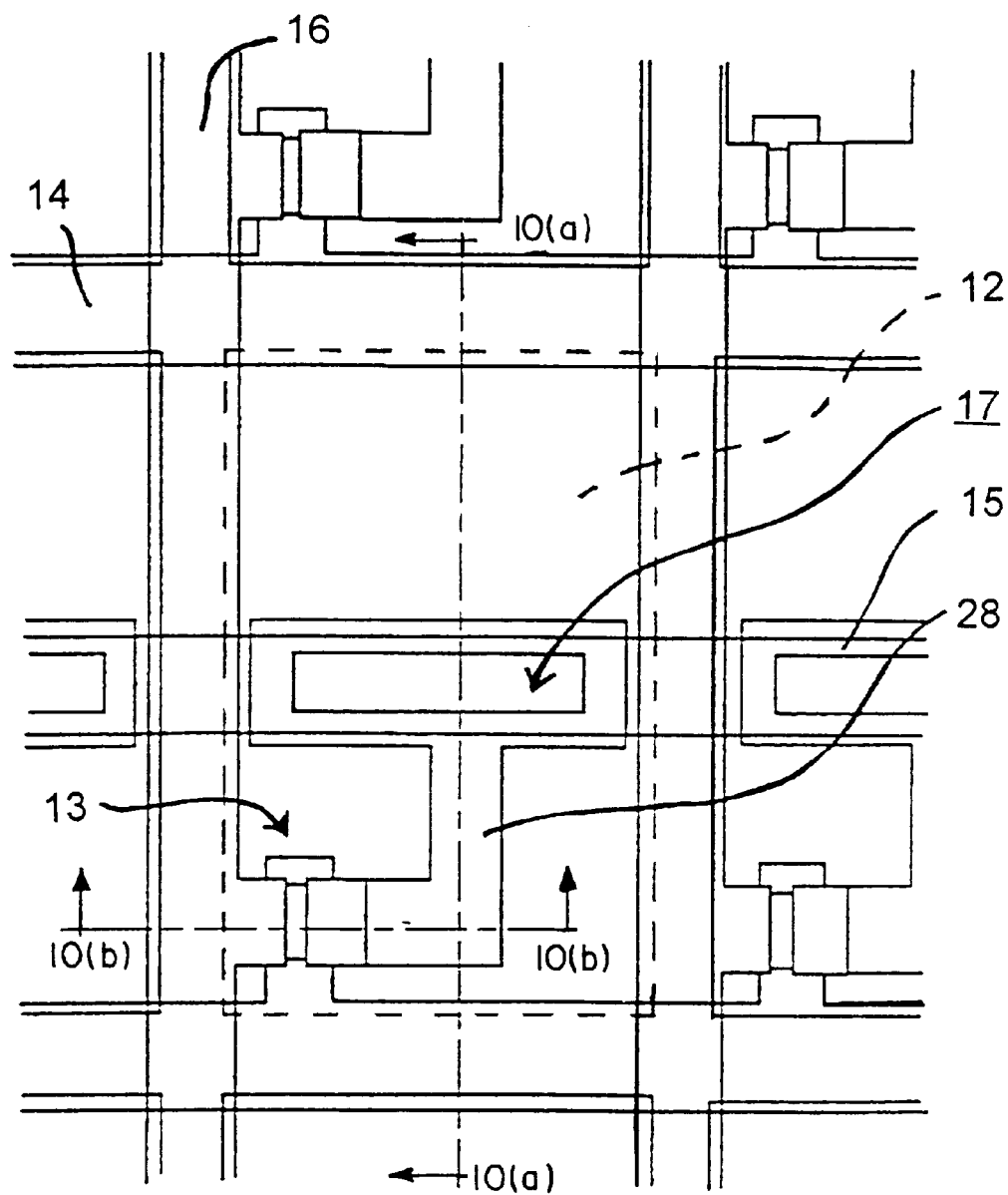
FIG. 9 is a plan view showing the construction of a pixel portion on an active matrix substrate in a conventional liquid crystal display device.
Figure 10A:
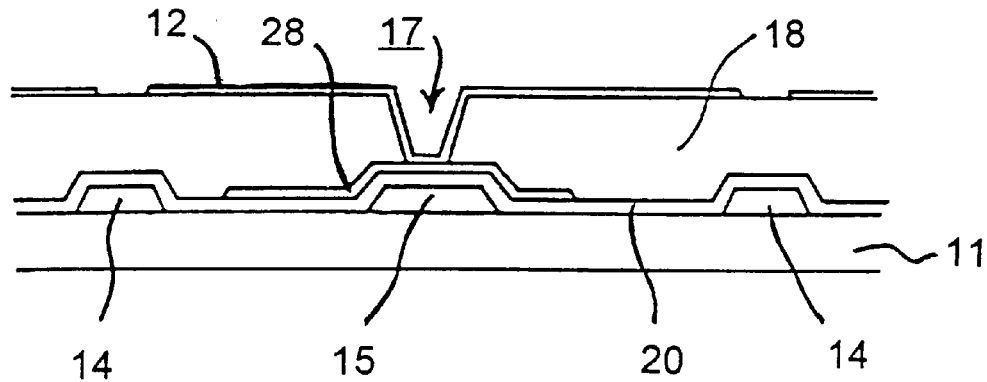
FIG. 10(a) is a sectional view of FIG. 9 viewed from the 10(a)—10(a) line.
Figure 10B:
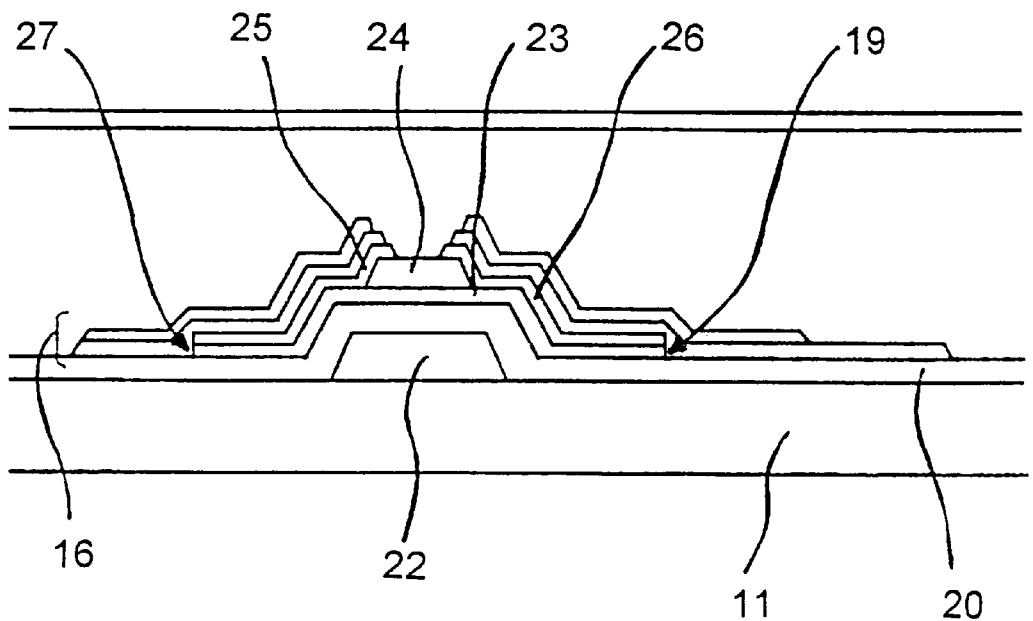
FIG. 10(b) is a sectional view of FIG. 9 viewed from the 10(b)—10(b) line, illustrating the construction of the TFT.
Figure 11A:
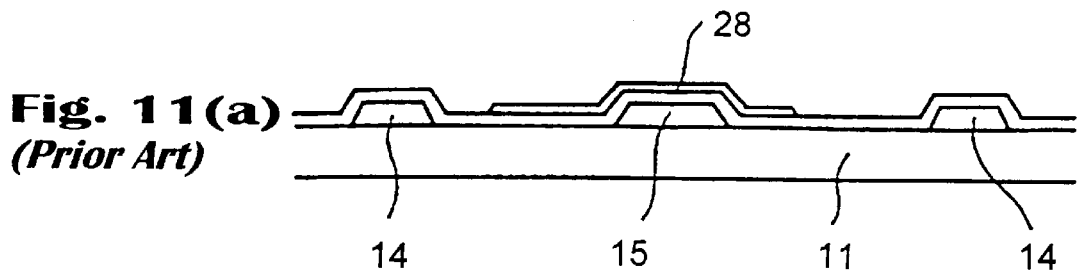
FIG. 11(a) through FIG. 11(c) are sectional views showing the process for manufacturing the portion as shown by FIG. 10(a).
Figure 11B:
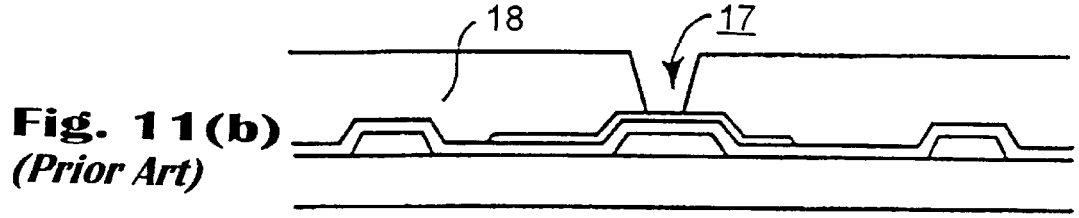
Figure 11C:
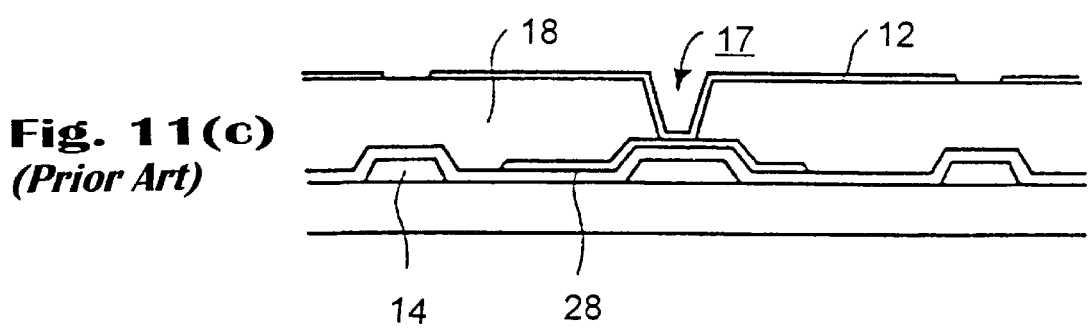

FIG. 7 is a sectional view showing the construction of the liquid crystal display device in Example 5. FIG. 7 corresponds to the section B-B' of FIG. 1(a).

In FIG. 7, the tapering shape of the contact hole 17 has been improved by forming the metal layer 32 between the contact hole 17 and the connecting electrode 28. In Example 5 of the present invention, the metal layer 32 is formed with tantalum in a film thickness of 3000 Å. Since the metal layer 32 can be formed simultaneously with the source signal wiring 16 (FIG. 1(a)) and the drain electrode 19 of the TFT portion (FIG. 2) as explained in the above Example 1, the manufacturing process does not become more complicated. Also, there is an advantage that, even if the metal layer 32 is formed, the additive capacitance is not reduced.

In the liquid crystal display device having an interlayer insulating film with a prescribed thickness according to the present invention, it is possible to provide a liquid crystal display device with better display quality and without leakage of light by obtaining a further high aperture ratio while maintaining the thickness of the interlayer insulating film, the tapering angle and the width of the bottom of the contact hole to be equal to those of a conventional one by setting the height from the surface of the substrate to the bottom of the contact hole to be larger than the height of the contact hole.

Moreover, since the tapering region can also be reduced if the height of the contact hole is reduced only by providing a layer other than the connecting electrode, the common additive capacitance wiring and the gate insulating film, it is possible to prevent the deterioration of display quality due to leakage of light while maintaining a high aperture ratio.

Furthermore, the tapering region can be effectively reduced without complicating the conventional manufacturing processes only by thickly forming any one of the connecting electrode, the gate insulating film and the common additive capacitance wiring provided under the contact hole, so that, while maintaining the high aperture ratio, no deterioration of the display quality due to leakage of light would be invited.

What we claim is:

1. A liquid crystal display device comprising:

a gate signal wirings formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, and the width of the contact hole at the aperture surface of the contact hole is reduced by setting the height from the surface of the substrate to the bottom of the contact hole to be larger than the height of the contact hole, wherein the connecting electrode is disposed directly under the contact hole and wherein an insulating layer, an electrically conductive layer, a gate insulating film, a common additive capacitance wiring and the substrate are disposed under the connecting electrode.

2. A liquid crystal display device according to claim 1, in which the width of the contact hole at the aperture surface of the contact hole is smaller than the width of the common additive capacitance wiring.

3. A liquid crystal display device comprising:

a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, and the width of the contact hole at the aperture surface of the contact hole is reduced by setting the height from the surface of the substrate to the bottom of the contact hole to be larger than the height of the contact hole, wherein the connecting electrode is disposed directly under the contact hole and in which an electrically conductive layer, a gate insulating film, a common additive capacitance wiring and the substrate are disposed under the connecting electrode.

4. A liquid crystal display device according to claim 3, in which the width of the contact hole at the aperture surface of the contact hole is smaller than the width of the common additive capacitance wiring.

5. A liquid crystal display device comprising:

a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, and the width of the contact hole at the aperture surface of the contact hole is reduced by setting the height from the surface of the substrate to the bottom of the contact hole to be larger than the height of the contact hole, wherein the connecting electrode is disposed directly under the contact hole and in which a gate insulating film, a common additive capacitance wiring and the substrate are disposed under the connecting electrode.

6. A liquid crystal display device according to claim 5, in which the width of the contact hole at the aperture surface of the contact hole is smaller than the width of the common additive capacitance wiring.

7. A liquid crystal display device comprising:

a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, and the width of the contact hole at the aperture surface of the contact hole is reduced by setting the height from the surface of the substrate to the bottom of the contact hole to be larger than the height of the contact hole, wherein an electrically conductive film is disposed directly under the contact hole and in which the connecting electrode, a gate insulating film, a common additive capacitance wiring and the substrate are disposed under this electrically conductive film.

8. A liquid crystal display device according to claim 7, in which the width of the contact hole at the aperture surface of the contact hole is smaller than the width of the common additive capacitance wiring.

9. A liquid crystal display device comprising:

a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, and the width of the contact hole at the aperture surface of the contact hole is reduced by setting the height from the surface of the substrate to the bottom of the contact hole to be larger than the height of the contact hole, wherein the tapering angle of the contact hole is 30 to 70° relative to the surface of the substrate.

10. A liquid crystal display device comprising:

a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film having a thickness of 2 to 6 µm, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, the contact hole being tapered with a tapering angle of 30° to 70° relative to the surface of the substrate, and the bottom of the contact hole is positioned at such a height from the surface of the substrate that the width of the contact hole at the aperture surface thereof does not substantially exceed the width of the connecting electrode where the connecting electrode is disposed under the contact hole.

11. A liquid crystal display device comprising:

a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film having a thickness of 2 to 6 µm, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film and via a connecting electrode, the contact hole being tapered with a tapering angle of 30° to 70° relative to the surface of the substrate, and the bottom of the contact hole is positioned at such a height from the surface of the substrate that the width of the contact hole at the aperture surface thereof does not substantially exceed the largest width of the connecting electrode where the gate signal wiring or the date signal wiring is disposed under the contact hole in addition to the connecting electrode.

12. A liquid crystal display device comprising:

a gate signal wiring formed on a substrate, a data signal wiring insulated from the gate signal wiring and formed to perpendicularly cross the gate signal wiring, a switching element provided near the perpendicularly crossing portion of the gate signal wiring and the date signal wiring and having a gate electrode and source/drain electrodes, an interlayer insulating film having a thickness of 2 to 6 µm, and a pixel electrode disposed in the region surrounded by the gate signal wiring and the data signal wiring and on the interlayer insulating film, wherein the gate signal wiring is connected with the gate electrode, the data signal wiring is connected with one of the source/drain electrodes, the pixel electrode is connected with the other of the source/drain electrodes through a contact hole penetrating through an interlayer insulating film, the contact hole being tapered with a tapering angle of 30° to 70° relative to the surface of the substrate, a conductive layer or a common additive capacitance wiring is disposed, or both a conductive layer and a common additive capacitance wiring are disposed, under the contact hole, and the bottom of the contact hole is positioned at such a height from the surface of the substrate that the width of the contact hole at the aperture surface thereof does not substantially exceed the largest width among the conductive layer and the common additive capacitance wiring.

13. A liquid crystal device according to claim 12, in which a connecting electrode is further disposed under the contact hole and in which the connecting electrode, the conductive layer and the common additive capacitance wiring are disposed under the contact hole.

* * * * *